US007895027B2

(12) United States Patent
Lin et al.

(10) Patent No.: US 7,895,027 B2
(45) Date of Patent: Feb. 22, 2011

(54) HDL RE-SIMULATION FROM CHECKPOINTS

(75) Inventors: Kuo-Ching Lin, Taichung (TW); Nan-Ting Yeh, Kaohsiung (TW); Kuen-Yang Tsai, Jhudong Township, Hsinchu County (TW)

(73) Assignee: Springsoft, Inc., Hsinchu (TW)

( * ) Notice: Subject to any disclaimer, the term of this patent is extended or adjusted under 35 U.S.C. 154(b) by 440 days.

(21) Appl. No.: 12/015,779

(22) Filed: Jan. 17, 2008

(65) Prior Publication Data

US 2009/0187394 A1 Jul. 23, 2009

(51) Int. Cl.
*G06F 17/50* (2006.01)
*G06F 9/00* (2006.01)

(52) U.S. Cl. .............................. 703/14; 703/22; 703/24; 716/6

(58) Field of Classification Search ................... 703/14, 703/22, 24; 716/6; 717/135
See application file for complete search history.

(56) References Cited

U.S. PATENT DOCUMENTS 6,425,762 B1 * 7/2002 Ernst ........................... 434/29

2006/0117274 A1 * 6/2006 Tseng et al. .................... 716/1
2007/0074135 A1 * 3/2007 Craig et al. .................... 716/5

* cited by examiner

*Primary Examiner*—Thai Phan
(74) *Attorney, Agent, or Firm*—Chernoff, Vilhauer, McClung & Stenzel

(57) ABSTRACT

A computer-based simulation process executes a checkpoint operation while simulating behavior of an electronic circuit by forking an active checkpoint process having the same state as the original simulation process. While simulation time for the simulation process continues to increase after executing the checkpoint operation, simulation time for the checkpoint process remains unchanged so that the checkpoint process remains in the state of the simulation at the simulation time it executed the checkpoint operation (the "checkpoint time"). When the checkpoint process subsequently receives a request to resume simulating the circuit, it forks a new simulation process that mimics the original simulation process as of checkpoint time, and the new simulation process then begins to advance its simulation time, thereby enabling it to re-simulate behavior of the electronic circuit previously simulated by the original simulation process starting from the checkpoint time.

22 Claims, 8 Drawing Sheets

HDL RE-SIMULATION FROM CHECKPOINTS

BACKGROUND OF THE INVENTION

1. Field of the Invention

The invention relates in to a circuit simulator that forks a simulation process at checkpoints to create a suspended checkpoint processes that can be resumed to initiate re-simulations from the checkpoints.

2. Description of Related Art

Digital IC designers use a hardware description language (HDL) such as Verilog, VHDL or SystemC to create a circuit design in the form of a behavioral description of an electronic circuit. Referring to FIG. 1, the design 100 describes a circuit as being formed by instances of transistors, logic gates and other devices that are interconnected by nets, interfaces or channels. Each device may be an instance of a standard cell having an internal structure described by a cell library 102, which also includes a mathematical module of cell behavior. The design usually organizes cell instances into a hierarchy of modules. For example in FIG. 1, design 100 organizes cell instances into a set of three high-level module instances A, B and C. Module A includes two lower level modules D and E, and module E includes two lower level modules F and G.

After creating the HDL design 100 for a circuit, a designer can employ a computer-based circuit simulator 104 to determine how the circuit it describes would respond to input signals based on the behavioral models provided by cell library 102. A "testbench" 106 includes the HDL design 100 describing the circuit along with statements 108 for controlling the time-varying behavior of test signal inputs to be applied to the circuit during the simulation and may include control statements 110 specifying various parameters of the simulation. A user may also provide control statements through a command script 111 that the simulator imports. Control statements 110 or command script 111 may tell simulator 104 to generate and save waveform data 112 representing the time-varying behavior of various signals the simulated circuit produces during the simulation. Following the simulation, a user can analyze waveform data 112 using a debugger 114, which produces waveform and other displays that help the designer debug the circuit.

Since simulator 104 usually produces much more waveform data during a simulation than it can store in random access memory (RAM), it must halt the simulation from time-to-time to write the waveform data it has generated to a hard disk 118 or other storage device so that it can free RAM space for more waveform data. It then resumes the simulation. A simulator can require many hours to simulate a large circuit, and may spend much of that time writing waveform data 112 to hard disk 118 because disk accesses are relatively slow. To reduce simulation time, a designer will usually program simulator 104 to save waveform data 112 for only a limited number of simulated circuit signals so that it need not spend so much time writing waveform data to hard disk 118. For example, a designer will often initially configure simulator 104 to save only waveform data representing the circuit input signals and the output signals of the various circuit modules and to discard waveform data representing behavior of the internal signals of most modules.

When debugging a circuit design based on waveform data 112 representing only module input and output signals, a designer may be able to deduce from the behavior of a module output signal that a particular module has a design error, but may not be able to track the error to any particular portion of that module since simulator 104 did not save waveform data representing behavior of signals that are internal to that module. In such case a designer may change control statements 110 of testbench 106 so that the simulator saves waveform data representing the internal signals of the particular module suspected of having a design flaw. After simulator 104 re-simulates the circuit and saves that more detailed waveform data 112, the designer can investigate the behavior of that module in more detail. A drawback to this approach is that re-simulations can require as much or more processing time as the original simulation, and since a designer may have to run several re-simulations in order to fully debug a design, the debugging process can be very time-consuming.

Designers have reduced re-simulation processing time by reducing the scope of the re-simulation so that the simulator re-simulate behavior only the modules believed to contain design flaws. Suppose, for example, that after reviewing waveform data representing output signals of each of the modules the designer deduces there is an error in module B and wants to collect waveform data for internal signals within module B during a re-simulation. The designer can reduce re-simulation time by modifying test bench 106 so that simulator 104 need re-simulate only module B and so that the testbench generates the input signals to module B based on waveform data 112 representing those module B input signals saved during the original simulation. Processing time for the re-simulation decreases simulator 104 need not simulate behavior of modules A and C.

Another known way to reduce re-simulation processing time is to limit the time span of the re-simulation. FIG. 2 shows a timeline for an example simulation in which a simulator requires one hour of processing time to simulate 1000 nanoseconds of circuit operation. In this example an initial simulation spanned 4500 nanoseconds of simulation time and required 4.5 hours of processing time. While subsequently debugging the results of the simulation, a designer discovered an error in a monitored signal at time T=2800 ns and suspects that the error propagated from errors in internal signals of one or more modules resulting from flawed logic during a limited period leading up to time T. The designer would like initiate a re-simulation to obtain waveform data for the internal signals, but rather than starting the re-simulation at simulation time 0 and ending it at simulation time 4500, the designer could reduce processing time by starting the re-simulation at a time closer to T and ending it immediately after simulation time T. A digital circuit typically includes devices such as registers, latches, flip-flops and random access memories that store data. The "state" of a simulated circuit at any given moment during the simulation is a function of the state of each data bit stored in those memory devices. The testbench defines the initial state of each stored bit at the beginning of the simulation (time T=0), but the state of those bits change as the simulation progresses. At any given moment during a simulation, the response of the simulated circuit to its input signals depends not only on the states of its input signals, but also on the states of data stored in its internal memory devices, which in turn depends on the history of its input signals. Hence if a simulator is to run a re-simulation starting at some time Tx>0, it is necessary that the re-simulation begin with all the simulated circuit's stored data set to the states they would have had at time Tx if the re-simulation had run from time 0 to time Tx.

Referring again to FIGS. 1 and 2 it is known to include control statements 110 in a testbench 106 for an original simulation that tell the simulator 104 to periodically stop the simulation and save "checkpoint data" 116 defining the current state of the simulation to a hard disk 118. As illustrated in FIG. 3, in addition to providing a kernel address space 120, random access memory (RAM) 122 of a computer processor executing a simulation process includes space for a block of simulation program code 124, for global variables 126, for a heap 128 and for a stack 130 employed by the simulation process. The simulation process will also employ various registers 132 within the computer processor for storing data. The checkpoint data 116 needed to save the current state of the process includes the global variables 126, the heap 128, the stack 130, and the contents of registers 132, along with other information 134 such as, for example, a file descriptor for identifying the checkpoint and any other information needed to restart the simulation program at the correct point. To restart the process from the checkpoint, it is necessary to read the checkpoint data 116 from the hard disk and write it back to the RAM and register locations it came from. Simulator program code 124 (i.e., testbench code), which may have been modified for the re-simulation, is also reloaded into memory 122 from its storage location elsewhere on the hard disk.

In the example of FIG. 2, the simulator was configured to save checkpoint data after 1000 ns of simulation time, which requires one hour of processing time, and the simulator therefore saved four blocks of checkpoint data during the original 4.5-hour simulation. Since the designer is only interested in re-simulating the circuit during a time immediately preceding time T=2800 ns, it is possible to restart the simulation at time Tx=2000 ns and end it at simulation time 2800 ns by using the checkpoint data saved at time 2000 ns to initialize the state of the simulation and by altering control statements in the testbench to tell the simulator to end at time 2800 ns. This saves 2 hours of processing time over starting the re-simulation at time 0.

The drawback to saving checkpoint data during the original simulation is that it requires disk accesses, which are time-consuming. The more frequently simulator 104 saves checkpoint data 116, the higher the resolution with which a designer is able to select starting times for subsequent re-simulations. For example if the designer is only interested in re-simulation the circuit for 100 ns of simulation time immediately preceding time T, re-simulation time could be further reduced if simulator 104 had been configured to save checkpoint data 116 after every 100 ns of simulation time. However, since saving checkpoint data to hard disk 118 is time-consuming, a designer would not configure simulator 104 to save checkpoint data too frequently because doing so would dramatically slow the original simulation.

SUMMARY OF THE INVENTION

A circuit simulator generates waveform data representing the behavior of signals of a circuit responding to a set of input signals that vary with time. The invention relates to a method for preserving the state of a circuit simulation at various times ("checkpoints") during the simulation to enable subsequent re-simulation of the circuit starting at any checkpoint. The circuit simulator is implemented in the form of a set of processes executed by a conventional computer, which stores information defining current states of those process in separate areas its random access memory (RAM).

In accordance with one aspect of the invention, a simulation process currently simulating behavior of a circuit executes a checkpoint operation at any particular time during the simulation by forking a checkpoint process in part by copying the information stored in RAM for the simulation process to another area of RAM. An operating system supporting the "copy-on-write" technique allows clone processes and their parent process to share the same memory content in RAM until any process modifies the content of a memory page, at which point the operating system actually allocates a new memory page for that process. The checkpoint process thus initially has the same state as the original simulation process at the checkpoint, and it remains in that state because it is immediately suspended as soon as it is created. Therefore, while the simulation process resumes simulating the circuit after the checkpoint, the checkpoint process remains in its original state and does not advance the simulation beyond the checkpoint.

In accordance with another aspect of the invention, when the circuit simulator subsequently receives a request to re-simulate the circuit starting at the checkpoint, the simulator can simply resume the suspended checkpoint process. Alternatively the simulator may fork a new simulation process from the suspended the checkpoint process, and then resume the new simulation process. The later alternative allows the suspended checkpoint process to remain in its original checkpoint state to allow the circuit simulator to respond to another request to re-simulate the circuit starting at that particular checkpoint, Forking a simulation process to create a checkpoint process in accordance with the invention is much quicker than the prior art method of creating a checkpoint by writing checkpoint data representing the current state of a simulation process to a hard disk. Similarly, resuming a checkpoint process, or forking a checkpoint process to create a new simulation process is much quicker than the prior at method of reading checkpoint data from a hard disk and starting a new simulation process based on the checkpoint data. Thus the invention reduces the amount of processing time needed to create checkpoints and to initiate re-simulations from checkpoints.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

The invention relates to computer software residing on computer-readable media, which when read and executed by a conventional computer, causes the computer to act as a circuit simulator. Suitable computer-readable media may include, but is not limited to, compact disks, floppy disks, hard drive disks, random access and read-only memory devices. While a preferred embodiment of the invention is described in detail below, those of skill in the art will appreciate that other embodiments of the invention are possible. The claims attached to this specification define the true scope and spirit of the invention.

Re-Simulations from Checkpoints

Figure 1:
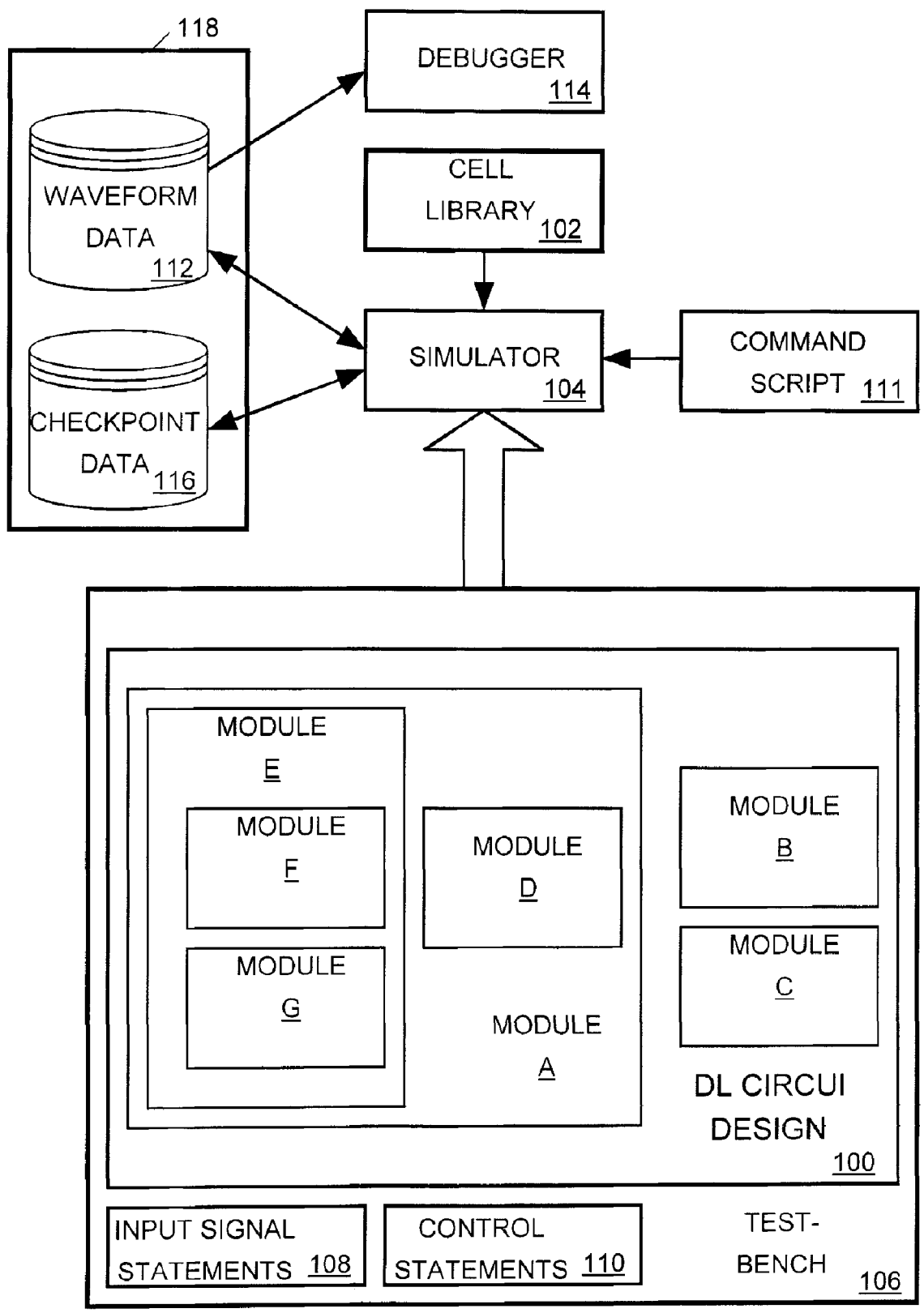
FIG. 1 depicts a prior art simulation system in block diagram form.
Figure 2:
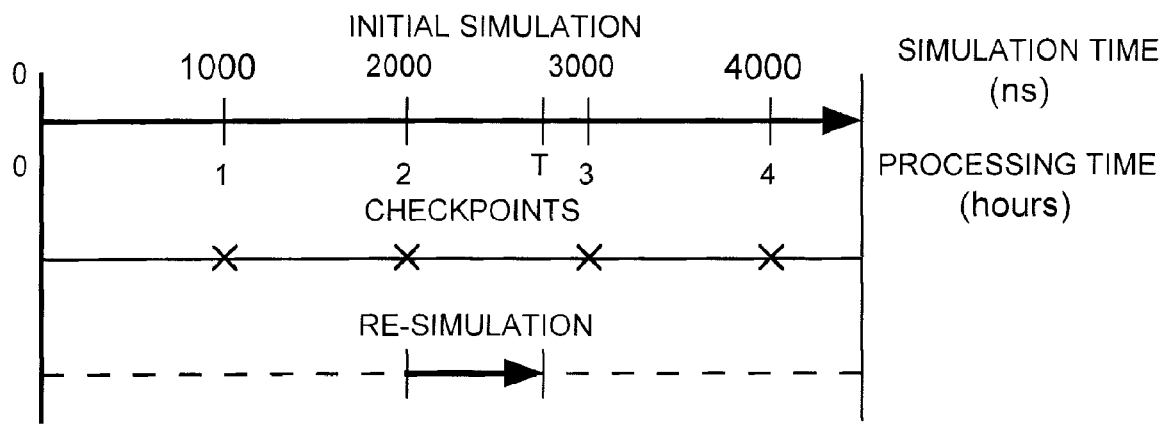
FIG. 2 depicts checkpoint and re-simulation operations of the simulation system of FIG. 1 in timing diagram form.
Figure 3:
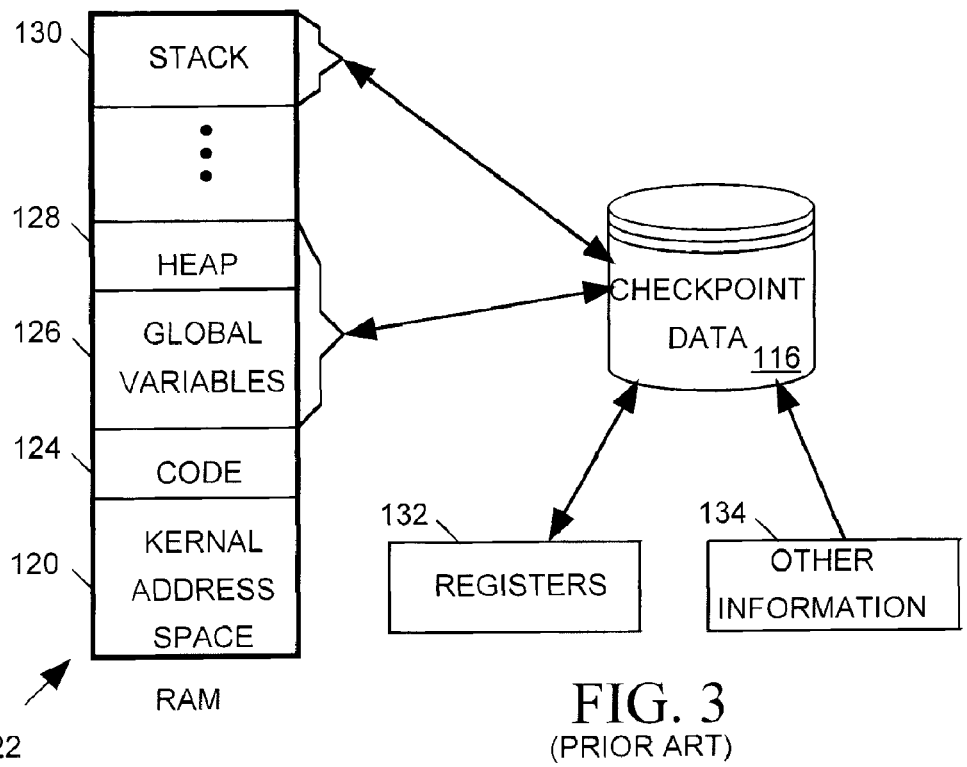
FIG. 3 depicts a checkpoint operation of the prior art simulation system of FIG. 1 in block diagram form.

The invention relates in particular to the manner in which a computer-based circuit simulator creates simulation checkpoints and initiates re-simulations from those checkpoints. Referring to FIG. 1, as discussed above, control statements 110 included in a testbench 106 or a command script 111 for a conventional simulator 104 can tell the simulator to save checkpoint data 116 describing the current state of a simulated circuit to a hard disk 118 at various times during a simulation. As illustrated in FIG. 2, a conventional simulator can periodically save checkpoint data, for example, every 1000 ns of simulation time. A user can request simulator 104 to re-simulate the circuit starting at any checkpoint because the simulator can restore itself to the state it had at that checkpoint based on the checkpoint data it saved during the original simulation. For example, as shown in FIG. 2, the simulator can run a re-simulation starting at simulation time 2000 ns based on the checkpoint data saved time 2000 ns during the original simulation.

One drawback to periodically saving checkpoint data to a hard disk during a simulation is that it can substantially extend the processing time needed to carry out the simulation since hard disk accesses are time-consuming. The time required to read the checkpoint data stored in a hard disk in order to begin a re-simulation also adds to total re-simulation time. The invention relates to a method implemented by a simulator for handling checkpoints and re-simulations in a way that can eliminate or significantly reduce disk accesses when a simulator encounters checkpoints and starts re-simulations.

A computer capable of implementing a simulation system in accordance with the invention includes a multithreading or multiprocessing operating system that can concurrently maintain more than one process in memory. While a computer program is a passive collection of instructions, a "process" refers to the actual execution of those instructions. The operating system reserves separate areas of random access memory (RAM) for each process for storing program instructions, data and other information relative to the process. Although a computer processor may be able to execute only one instruction at a time, a multithreading operating system can rapidly switch the processor between several active processes in a time-sharing fashion. A process can "fork" a "child" process that is a copy itself (the "parent process") by creating a separate address space for the child process and storing data in that address space that is an exact copy of all memory segments used by the parent process. An operating system can "suspend" a process by refraining from allocating processor time for executing instructions for that process, for example to devote more processor time to a higher priority process. A suspended process remains in memory, however, so the computer can subsequently "resume" the process by allocating processor time to the process. When a process "terminates", the operating system frees its allocated RAM space.

Figure 4:
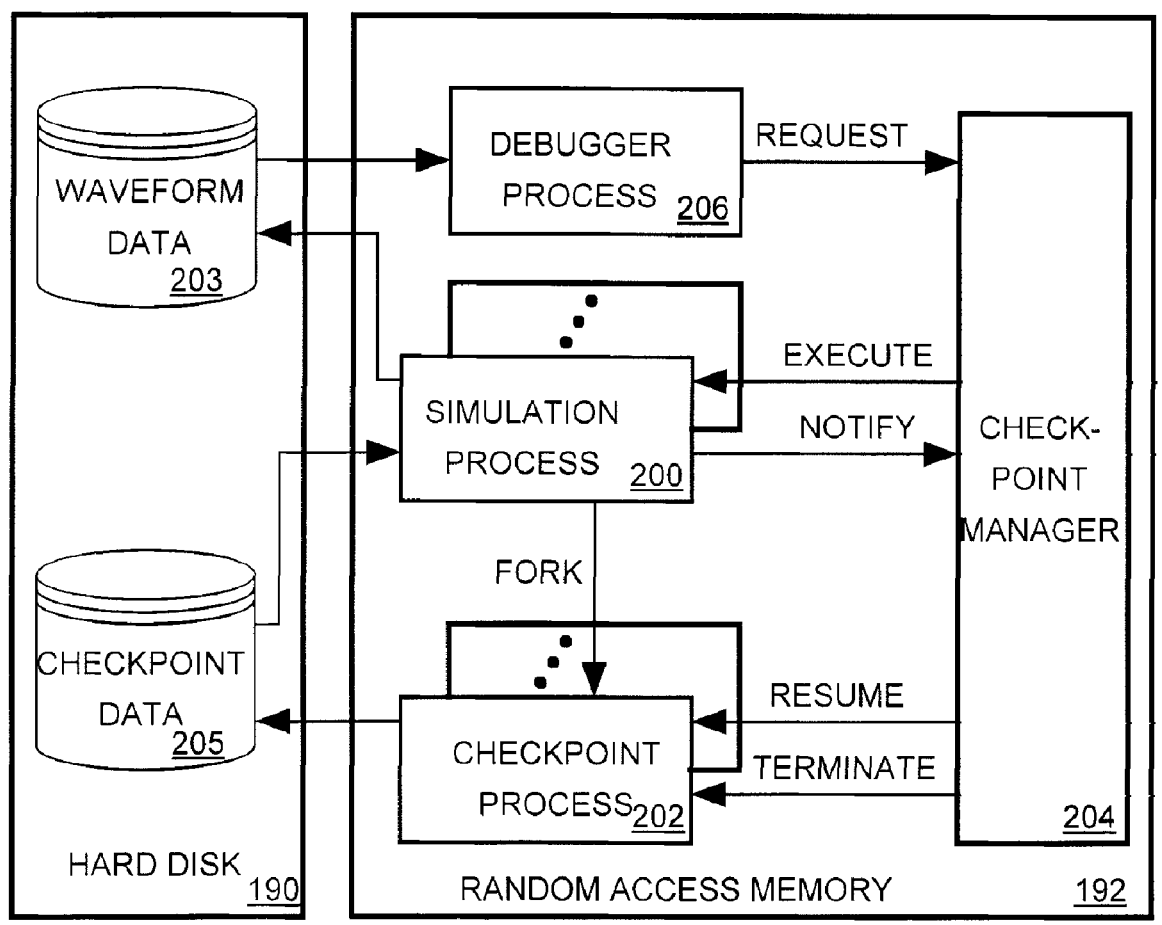
FIG. 4 depicts a simulation system in accordance with the invention in block diagram form.

As illustrated in FIG. 4, a computer implementing a simulation system in accordance with the invention includes a random access memory 192, and its operating system reserves separate areas of RAM 192 for several processes (200, 202, 204, and 206). A simulation process 200 simulates the behavior of a circuit and writes waveform data 203 to a hard disk 190 representing the time-varying behavior of selected signals of the circuit being simulated. A debugger process 206 responds to user input by reading the waveform data 203 produced by simulation process 200 and producing waveform and other displays based on that data to help a circuit designer debug the circuit design.

In accordance with one aspect of the invention, simulation process 200 carries out a succession of checkpoint operations by forking a suspended child "check point process" 202 at each checkpoint. Although the parent simulation process 200 continues to simulate circuit following each checkpoint, the child checkpoint process remains suspended in its current state and does not advance its copy of the simulation beyond the checkpoint. Since forking a process mainly involves only copying data from one part of RAM to another, and does not involve writing data to a hard disk, each checkpoint operation does not add signification to simulation processing time.

A checkpoint manager process 204 keeps track of the checkpoint processes 202 the simulation process 200 has created, and when a user wants the simulator to re-simulate the circuit starting at one of the checkpoints, the user sends a re-simulation request to checkpoint manager 204 identifying the checkpoint. In the preferred embodiment of the invention, debugger process 206 acts as an interface between the user and checkpoint manager 204, for example by displaying icons on waveform displays representing available checkpoints and allowing a user to initiate a re-simulation starting at a particular checkpoint by clicking on its displayed checkpoint icon. Those of skill in the art will appreciate that other types of interfaces between the user and checkpoint manager 204 are possible.

In the preferred embodiment of the invention, when checkpoint manager 204 receives a request to initiate a re-simulation starting at a particular checkpoint, it resumes the checkpoint process 202 that was created at that checkpoint and signals it to fork a new active simulation process 200, which resumes simulating the circuit starting at that checkpoint. The checkpoint process 202 is thereafter once again suspended so that later, if a user wishes to again run the simulation from the same checkpoint, the checkpoint process 202 is available to fork yet another simulation process 200.

In an alternative embodiment of the invention, checkpoint manger 204 responds to the request to initiate the re-simulation from a checkpoint by saving checkpoint data 206 representing the current state of the corresponding checkpoint process 202 to hard disk (or other bulk storage device) 190 and then resuming the checkpoint process so that it directly begins simulating the circuit from the checkpoint rather than forking a new simulation process 202. If a user later requests checkpoint manager 204 to initiate yet another re-simulation from that checkpoint, the checkpoint manager creates a new simulation process 200 to carry out the re-simulating based on the checkpoint data 205 stored in hard disk 190. This approach helps to limit the number of suspended checkpoint processes 202 that need be stored in RAM 192 but slows the process of starting a re-simulation by requiring a write disk access.

In another embodiment of the invention, checkpoint manger 204 responds to the request to initiate the re-simulation from a checkpoint by immediately resuming the checkpoint process without forking a new simulation process and without saving checkpoint data 205 to hard disk 190. This approach helps to limit the number of suspended checkpoint processes 202 stored in RAM 192 and saves processing time because it does not require either a process fork or a disk access prior to starting a re-simulation, but it allows a user to request a re-simulation from any given checkpoint only once. In some embodiments of the invention, checkpoint manager 204 allows a user to select any one of the three options for handling checkpoint processes upon starting a re-simulation.

Since the amount of RAM 192 is limited, only a limited number of suspended checkpoint processes 202 can concurrently reside in the RAM. Assuming the simulator can allocate sufficient RAM space to accommodate some number N>1 of checkpoint processes, then if the original simulation process 200 forks no more than N checkpoint processes 202 during a simulation, then all checkpoint processes 202 can remain in RAM 192. If, however, the simulator forks more than N checkpoint processes 202, then whenever the number of checkpoint processes in RAM reaches N, it is necessary to terminate a suspended checkpoint process to free sufficient RAM space for a next checkpoint process to be created. Accordingly, simulation process 200 notifies checkpoint manager 204 whenever it forks a new checkpoint process 202, and whenever the number of checkpoint processes 202 residing in RAM 192 reaches N, checkpoint manager 204 writes checkpoint data 205 to hard disk 190 representing the state of the oldest checkpoint process 202 currently occupying space in RAM 192 and then terminates that checkpoint process, thereby freeing RAM space for the next checkpoint process 202 simulation process 200 may create. If a user subsequently requests checkpoint manager 204 to run a re-simulation of the circuit starting at a checkpoint for a terminated checkpoint process, the checkpoint manager initiates a new simulation process 200 having the state indicated by the checkpoint data 205 for terminated checkpoint process.

The invention saves processing time by reducing or eliminating hard disk accesses needed to save and retrieve checkpoint data 205 when establishing checkpoints and when starting re-simulations from checkpoints. A simulation system in accordance with the invention may write checkpoint data 205 to hard disk 190 when creating a checkpoint, but only when the number of checkpoint processes occupying space in RAM 192 reaches a predetermined limit. The simulation system may also read checkpoint data 205 from the hard disk 190 in order to start a re-simulation, but only when a user has requested it to start a re-simulation process from a checkpoint corresponding to a previously terminated checkpoint process 202. As long as the number of checkpoints created remains under the limit, the simulator need not write or read access checkpoint data 205 in hard disk 190, though it will write checkpoint data to the hard disk upon exiting the simulation.

Figure 5:
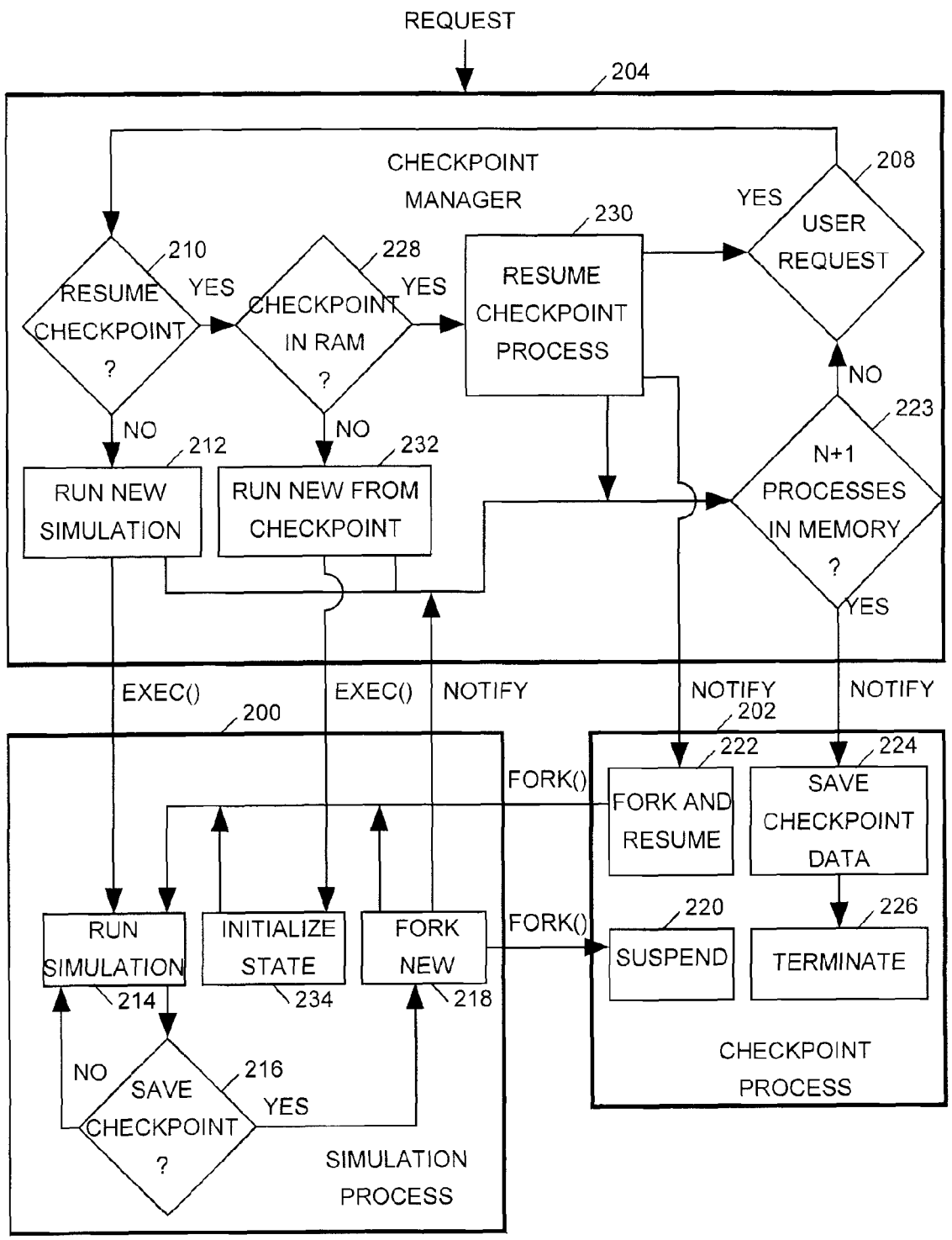
FIG. 5 depicts processes running on the simulation system of FIG. 4 in block diagram form.

FIG. 5 illustrates simulation process 200, checkpoint process 202 and checkpoint manager 204 of FIG. 4 in more detail. On system startup (step 208), checkpoint manager 204 waits for a request from a user. When the user requests the checkpoint manager 204 to start a new simulation rather than to resume a selected checkpoint (step 210), the checkpoint manager will (at step 212) execute a new simulation process 200 to run a simulation program defined by a user-provided testbench (step 214). The testbench includes control statements requiring the simulation process 200 to establish checkpoints at specified times during the simulation, when specified events occur, or when a user interactively requests a checkpoint. When simulation process 200 determines it must save a checkpoint (step 216), it forks a new checkpoint process 202 (step 218) as a copy of the simulation process 200 that is initially suspended (step 220). The simulation process 200 may use any kind inter-process-communication (IPC) to notify checkpoint manager 204 that it has created a new checkpoint process 202. After forking the new checkpoint process 202 at step 218, the simulation process 200 resumes running the original simulation (step 214) until it either encounters a next checkpoint (step 216) or until it terminates upon completion of the simulation.

The new checkpoint process 202 is suspended until checkpoint manager 204 determines that it is to resume the simulation starting from the checkpoint (step 222) or that the checkpoint process is to be terminated (step 226) after saving checkpoint data to a hard disk (step 224). When the user later requests checkpoint manager 204 to rerun a simulation from a selected checkpoint (step 210), the checkpoint manager determines whether a checkpoint process 202 for that checkpoint still resides in memory (step 228). If so, then in the preferred embodiment of the invention, checkpoint manager 204 notifies that particular checkpoint process 202 that it is to fork a new simulation process 200 that resumes the simulation starting from the selected checkpoint (step 214). After the fork operation (step 222), the checkpoint process 202 is again suspended so that it remains in its initial state. As discussed above, the checkpoint manager may alternatively resume checkpoint process 202 so that it directly carries out the re-simulation without forking a new simulation process.

Checkpoint manager 204 counts the number of checkpoint processes currently residing in RAM (step 223) and whenever its count reaches a predetermined number N, it writes checkpoint data 205 to hard disk 190 representing the state of the oldest checkpoint process 202 in RAM (step 224) and then terminates the checkpoint process (step 226). The user can alternatively configure checkpoint manager 204 to refrain from terminating any checkpoint processes, and in such case, the operating system will use virtual memory (i.e. hard disk 190) for storing the suspended checkpoint processes when there are more suspended checkpoint processes than RAM 192 can accommodate.

When the user requests checkpoint manager 204 to run a re-simulation from a specified checkpoint (step 210), and the checkpoint manager determines that the checkpoint process 202 for that checkpoint no longer resides in memory (step 228), checkpoint manager 204 initiates a new simulation process 200 (step 232) for the re-simulation, configuring the initial state of the simulation process based on checkpoint data 205 its reads from hard disk 190 (step 234) so that the simulation resumes from the specified checkpoint (step 214).

Limited Scope Re-Simulation

Figure 6:
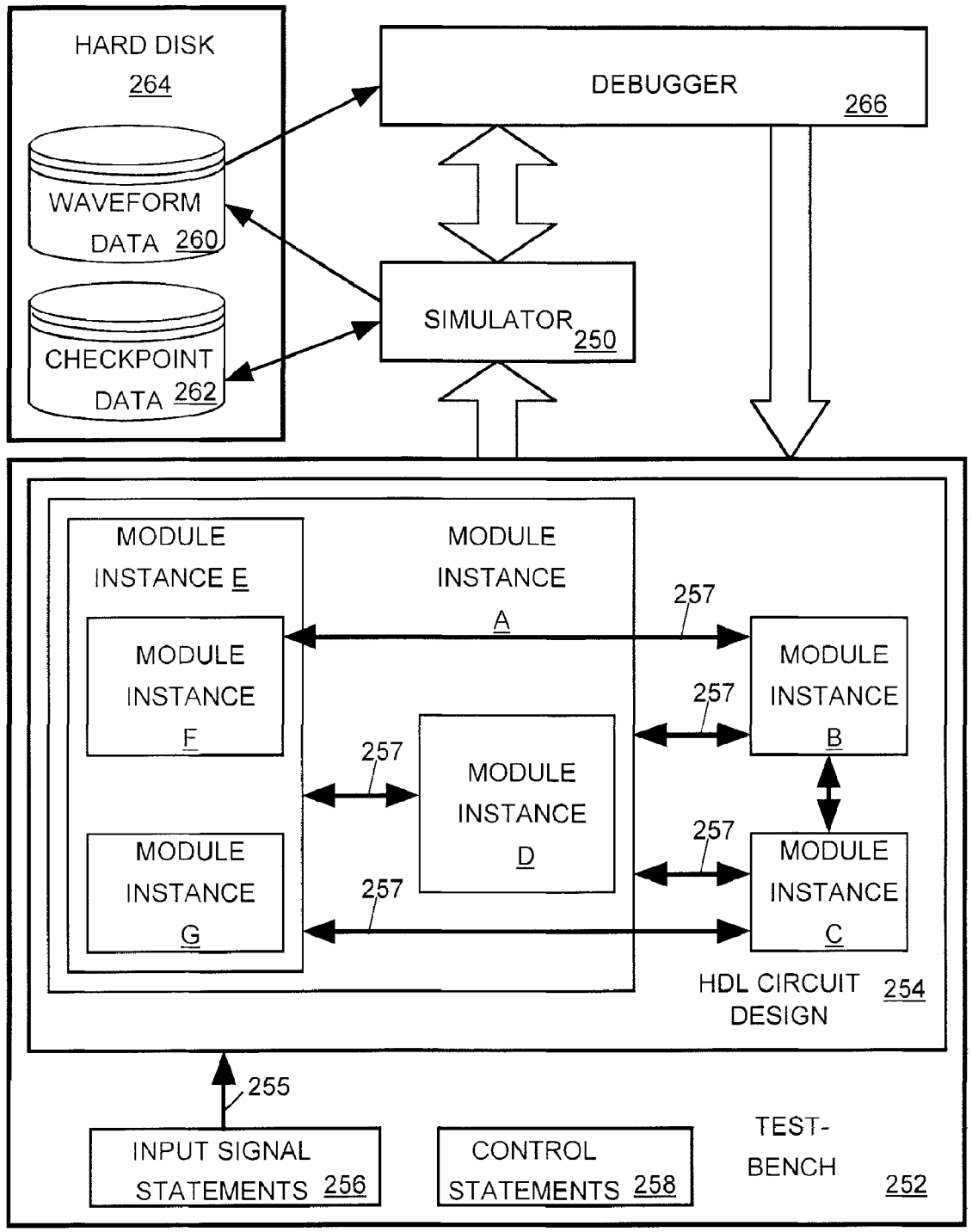
FIGS. 6 and 7 depict a simulation system in accordance with the invention in block diagram form.

Referring to FIG. 6, a simulator 250 runs a simulation process executing a testbench 252 including an design 254 describing a circuit to simulate behavior of the circuit. Design 254 describes the circuit as a set of module instances organized into a hierarchy of module instances including, for example, a set of three high-level modules instances A-C, a pair of intermediate-level modules instances D and E forming module instance A, and a pair of lower-level modules instances F and G forming module instance E. Testbench statements 256 describe the behavior of circuit input signals 255 during the simulation and control statements 258 tell simulator 250 to save waveform data 260 representing the behavior of various circuit signals during the simulation and to create checkpoints at selected times during the simulation. Simulator 250 could, for example, create checkpoints in the manner described above by forking checkpoint processes and, when necessary, by saving checkpoint data 262 to a hard disk 264. Alternatively simulator 250 could save checkpoint data 260 to hard disk 264 whenever it encounters a checkpoint, rather than creating checkpoint processes.

A circuit designer can use a debugger 266 to review waveform data 260 to determine whether there may be design errors in any of module instances A-E based on the behavior of their input and output signals. Since saving waveform data 260 to hard disk 264 is time consuming, control statements 258, for example, tell simulator 250 to save waveform data representing only the circuit input signals 255 and the input and output signals 257 of all module instances A-D. Accordingly, although simulator 250 would generate data representing data of all circuit signals in the course of simulating the circuit, it would not save waveform data 260 representing behavior of signals that are wholly internal to module instances A-G, and therefore does not make such waveform data available to debugger 266. Thus although a designer may be able to deduce that an error occurred in one of modules instances A-D based on the waveform data representing the input and output signals of those modules, the waveform data may not help the designer to determine the source of the error within that module instance.

Assume, for example, that upon reviewing waveform data 260 depicting the behavior of the input and output signals of module instance E, the designer determines module instance E has an internal design flaw, but since the waveform data 260 does not describe the behavior of any of the internal signals of module instance E, the designer is not able to determine how the design of module instance E is flawed. To investigate the internal behavior of module E in more detail, the designer could request debugger 266 to alter control statements 258 so that they tell simulator 250 to save waveform data 260 representing all of the internal signals of module E and then have simulator 250 re-simulate the circuit to make that new waveform data 260 available to debugger 266.

Figure 7:
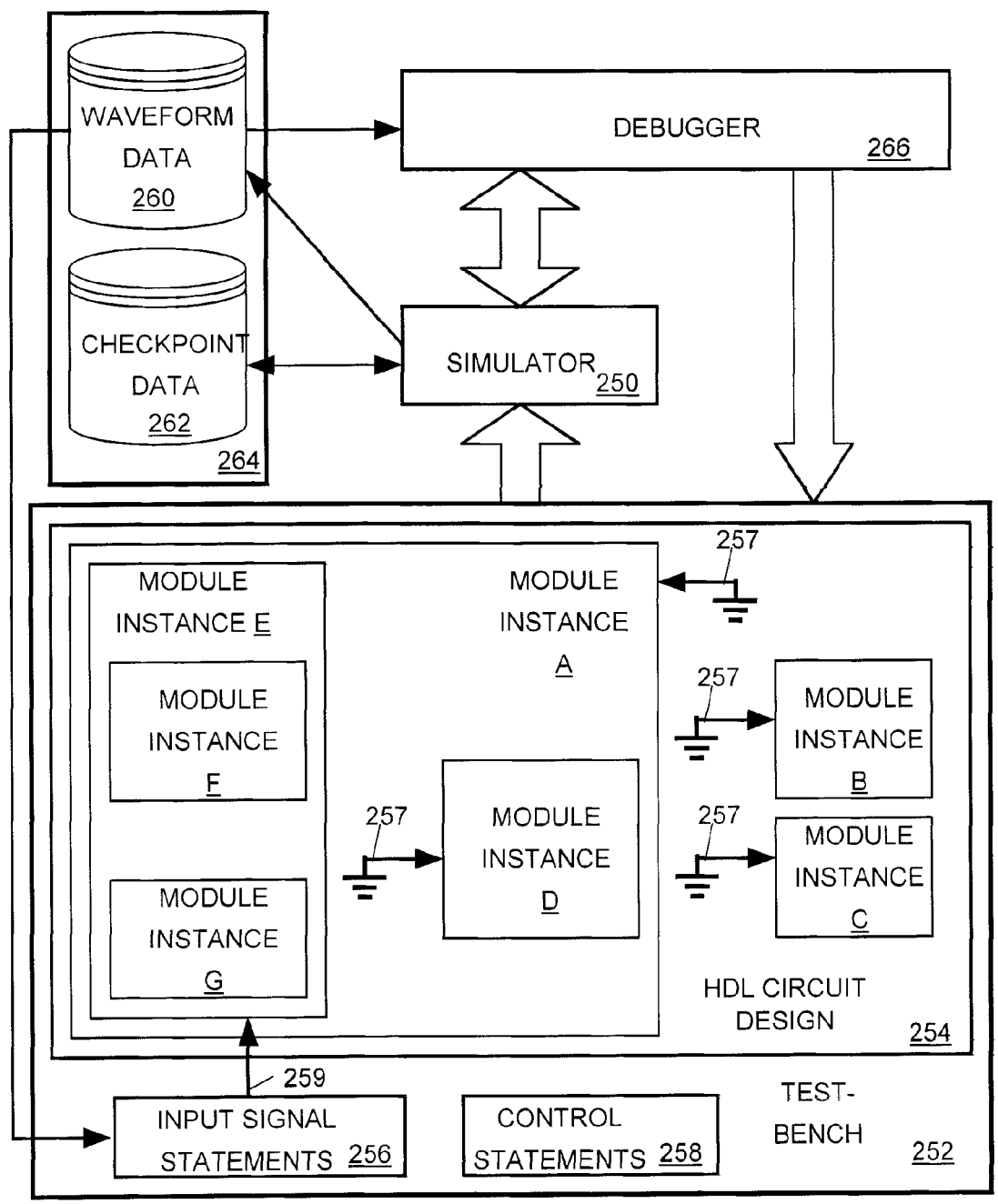

Referring to FIG. 7, since re-simulating the entire circuit described by design 254 is time-consuming, the designer may configure simulator 250 to reconfigure testbench 254 to limit the scope of the re-simulation so that the simulator simulates only module instance E. Simulator 250 can do this, for example, by reconfiguring the testbench 252 to force the input signals 257 to module instances A-D to ground at all times, thereby preventing simulator 250 from having to determine how modules instances A-D would respond to changes in those input signals. Since module instance E received some of its input signals from module instances B-D during the original simulation, it is necessary to modify input signals statements 256 to control the behavior of all input signals 259 to module instance E so that module instance E receives the same input signal patterns from testbench 252 during the re-simulation that it received from modules B-D during the initial simulation. Since simulator 250 saved waveform data 260 representing the behavior of all module instance E input signals, input signal statements 256 can tell program simulator 250 to derive the behavior of those input signals 259 from the previously saved waveform data 260. Control statements 258 are also modified to prevent simulator 250 from having to save waveform data 260 depicting the input and output signals of modules A-D.

Limited Scope Re-Simulation from Checkpoints

Figure 8:
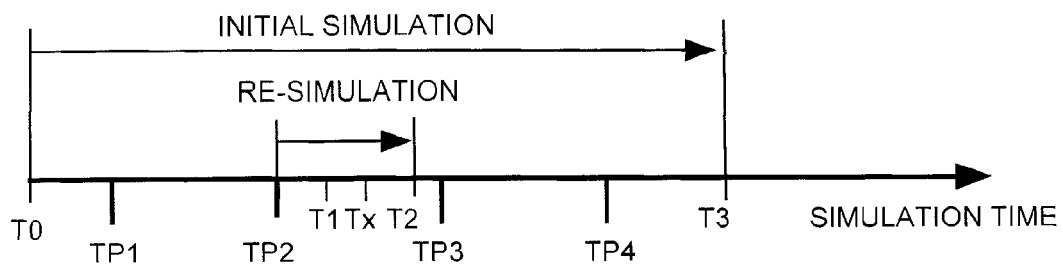
FIG. 8 depicts checkpoint and re-simulation operations of the simulation system of FIG. 6 in timing diagram form.

Assume as shown in FIG. 8 that the initial simulation based on the testbench 252 of FIG. 6 ran from simulation time 0 to some simulation time T3 and that simulator saved checkpoints at times TP1-TP4. When the designer determines from the waveform data 260 collected during the original simulation that an error occurred at simulation time Tx in an output signal of module instance E, the designer may request debugger 266 to initiate a re-simulation only of module E starting at time starting as soon as possible before time T1 and ending at time T2. Debugger 266 responds by reconfiguring the test bench 252 as illustrated in FIG. 7 to re-simulate only module D and run the re-simulation only from the latest checkpoint TP2 preceding time T1.

Figure 9:
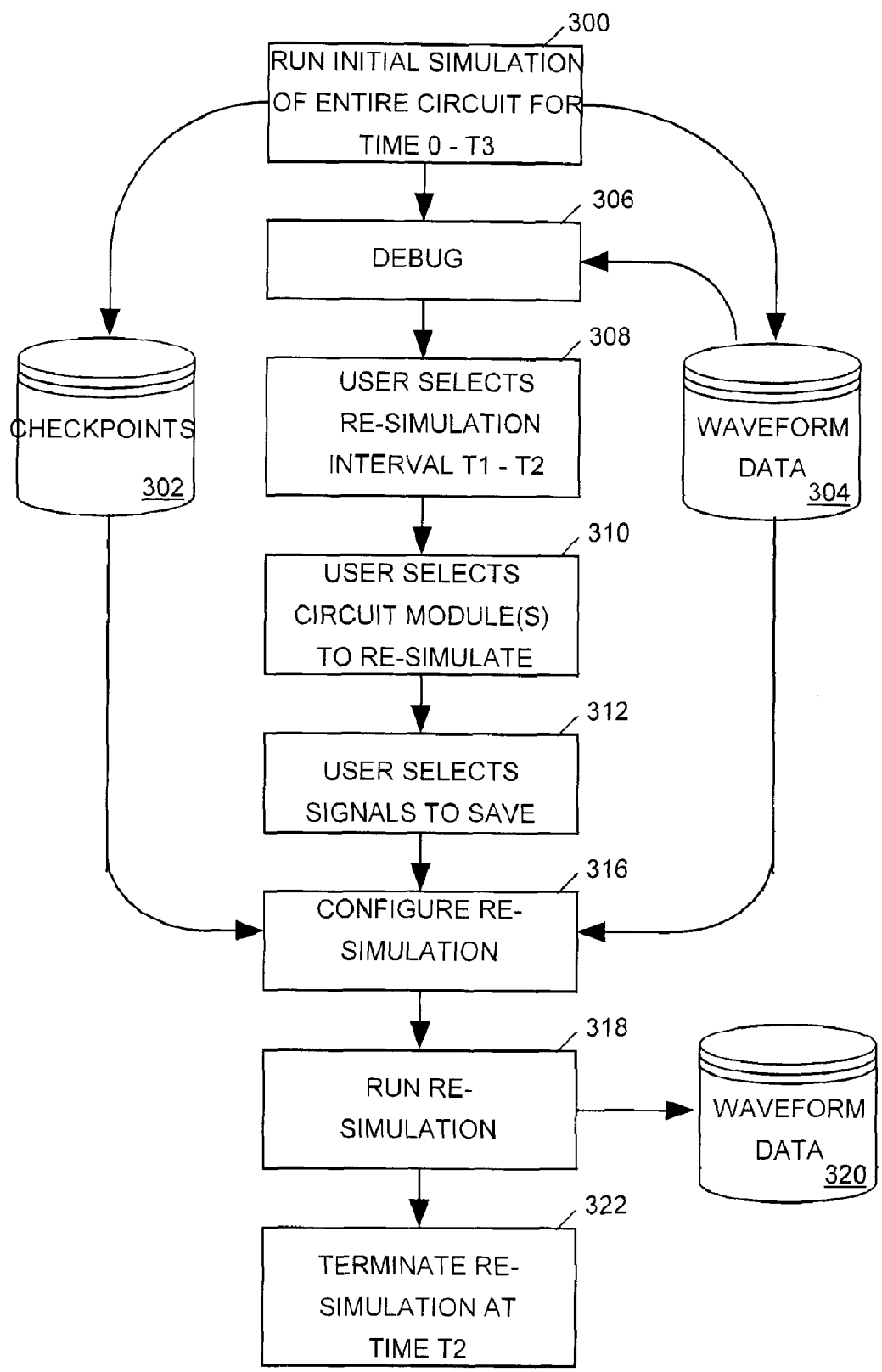
FIGS. 9 and 10 illustrate operations of the debugger of FIG. 6 in dataflow diagram form.

FIG. 9 illustrates an example procedure debugger 266 of FIG. 6 carries out in response to user input. Debugger 266 initially requests simulator 250 to start a simulation process to simulate a circuit in response to a user-supplied testbench 252 (FIG. 6) specifying a simulation time interval T0-T3 (step 300) as illustrated in FIG. 8. The simulation process carries out checkpoint operations at times TP1-TP4 either by forking the simulation processes as described above to create checkpoint processes, or by saving checkpoint data to a hard disk. The simulation process also saves waveform data 304 representing behavior of module input and output signals. Debugger 266 produces waveform and other displays based on waveform data 304 to help the user debug the design (step 306).

The user then discovers the error in a signal occurring at simulation time Tx (FIG. 8) and believes the error occurred as a result of a design flaw within a particular set of modules, the user would like simulator 250 to re-simulate only that particular set of modules during a limited simulation time interval T1-T2 surrounding simulation time Tx at which the error occurred and to produce additional waveform data 320 representing behavior of signals that are internal to those particular modules during that interval. The user therefore requests debugger 266 to initiate a re-simulation, with the user selecting a particular time interval T1-T2 to be re-simulated (step 308), selecting the particular circuit modules to be re-simulated (step 310), and selecting the particular signals to be represented by the waveform data 320 that is to be saved during the re-simulation. Debugger 266 then (step 316) configures simulator 250 to initialize a simulation process that re-simulates only the selected modules starting at checkpoint TP2 (FIG. 8), the last checkpoint saved prior to the desired re-simulation starting simulation time T1 and ending at simulation time T2. The simulation process uses the previously acquired waveform data 304 representing the behavior of the input signals to the selected modules during the initial simulation at step 300 as a basis for controlling the behavior of the input signals to those modules during the re-simulation. During the re-simulation (step 318), the simulation process saves waveform data 320 only for the signals within the selected modules, and only for the simulation time interval T1-T2, since the user is not interested in reviewing signal behavior between times TP2 and T1. The re-simulation process ends at simulation time T2 (step 322).

Breakpoint Operations

Referring to FIG. 6, a user can include breakpoint control statements 258 in the testbench 252 telling the simulator 250 to suspend the simulation at selected simulation times, or when the simulation reaches particular lines of the design source code. This allows the user to use debugger 266 to view the waveform data 260 that simulator 250 produced up to that point to determine whether any signal error has occurred before resuming the simulation. Although the waveform data 260 simulator 250 writes to the hard disk 260 during a simulation normally represents behavior of a limited number of signals, control statements 258 may tell simulator 250 to write data representing the current states of many other circuit signals to the hard disk at the moment each breakpoint occurs since such state data can help the user discover errors in other signals occurring at the breakpoint. If the user discovers any signal errors, the user may want to try to track down the source of the error by requesting debugger 266 for a re-simulation of a selected portion of the circuit from a checkpoint as discussed above without resuming the suspended initial simulation.

Figure 10:
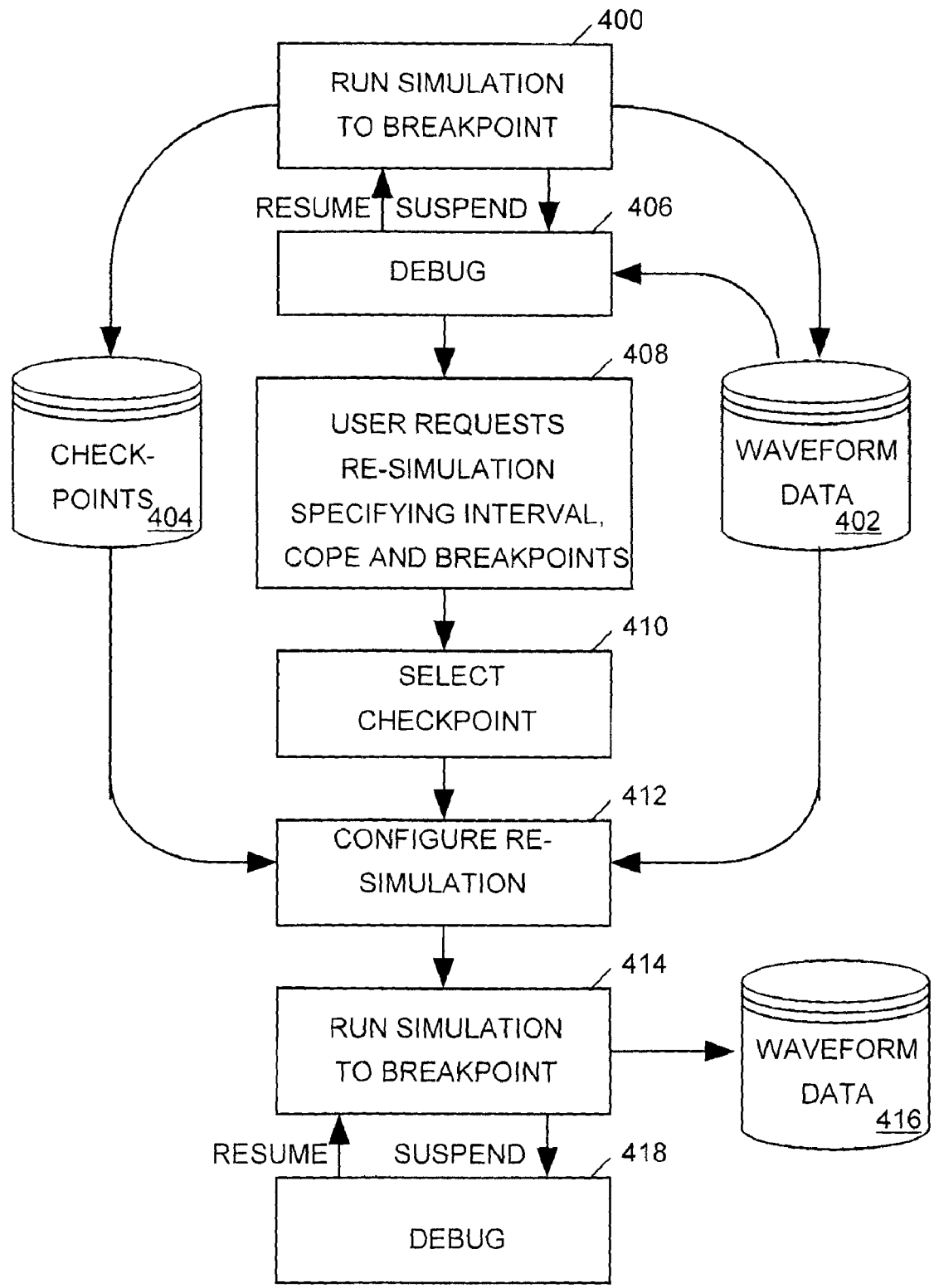

The breakpoints help the user to determine a time range in which when a signal error is likely to have originated when the designer can see that an error occurred after one breakpoint and before a next. This helps the user to decide how to limit the time range of the re-simulation. The user may also invoke a limited time range re-simulation that will execute breakpoints more frequently than the original simulation. Also, when the user determines a signal error occurred before the first breakpoint, the user may want to restart the simulation with simulator 250 programmed to execute a new set of breakpoints that start earlier in the simulation and occur more frequently. As illustrated in FIG. 10, in order to reduce re-simulation time, debugger 266 starts the re-simulation from the last checkpoint that occurred before the first new breakpoint.

Referring to FIGS. 6 and 10, as simulator 250 runs the initial simulation up to a first breakpoint (step 400), it writes waveform data 402 to the hard disk and creates a set of checkpoints 404, either by forking checkpoint processes as described above or by writing checkpoint data to the hard disk. After the first breakpoint, the user debugging the waveform data 402 (step 406) can send a request to the checkpoint manager to resume the simulation process until a next break point (step) 400. If the user discovers at any pass through step 406 that an error occurred, the user can send a request to the checkpoint manager to initiate a re-simulation, with the request specifying a desired re-simulation interval, the scope of the re-simulation (i.e. the particular portion of the circuit to be re-simulated) and the timing for a new set of breakpoints during the re-simulation interval (step 408). Debugger 266 selects the last checkpoint 404 occurring at a simulation time before the desired re-simulation interval (step 410), and then reconfigures the simulator 250 to start a new re-simulation process from the selected checkpoint, with the re-simulation process being instructed to suspend at the specified breakpoints (step 412). The re-simulation then runs until it suspends at a first breakpoint (step 414), writing new waveform data 416 to the hard disk. The user can then debug the new waveform data (step 418) and then, if desired request the checkpoint manager to resume the re-simulation.

Thus has been shown and described a computer-based simulation system that executes a checkpoint operation by forking the simulation process to create a suspended checkpoint process having the same state as the original simulation process and which initiates a re-simulation from a checkpoint by resuming the checkpoint process or by forking the checkpoint process to create a new simulation process that is resumed. Such checkpoint and re-simulation operations can be used to speed up limited time, limited scope and breakpoint re-simulations.

The invention claimed is:

1. Computer-readable media, which when read and executed by a computer employing an operating system enabling process forking, causes the computer to carry out a method for simulating behavior of an electronic circuit and then re-simulating behavior of at least a portion of the electronic circuit in response to an input re-simulation request, the method comprising the steps of:

a. initiating a first simulation process for simulating the behavior of the electronic circuit; wherein the first simulation process forks at least one checkpoint to create a checkpoint process that is a copy of the first simulation process, and wherein the first simulation process simulates the behavior of the electronic circuit following each checkpoint;

b. suspending each checkpoint process upon its creation; and c. responding to a first re-simulation request invoking a first checkpoint by resuming the checkpoint process that was created at the first checkpoint.

2. The computer-readable media in accordance with claim 1 wherein the
 resumed checkpoint process simulates behavior of at least a portion of the circuit following the first checkpoint.

3. The computer-readable media in accordance with:
 claim 1 wherein step c comprises responding to the first re-simulation request by writing checkpoint data to a storage device prior to resuming the checkpoint process at step c, said checkpoint data representing a state of the checkpoint process that was created at the first checkpoint and was suspended at step b.

4. The computer-readable media in accordance with claim 3 wherein the method further comprises the step of:
 d. responding to a second re-simulation request invoking the first checkpoint by reading the checkpoint data from the storage device and initiating a second simulation process of a state determined in accordance with the checkpoint data, wherein the second simulation process simulates behavior of at least a portion of the circuit following the first checkpoint.

5. The computer-readable media in accordance with claim 1 wherein
 step c comprises forking the resumed checkpoint process to create a second simulation process, which simulates the behavior of at least a portion of the circuit following the first checkpoint, and suspending the resumed checkpoint process.

6. The computer-readable media in accordance with claim 1 wherein the first simulation process generates waveform data representing behavior of input signals to a first portion of the electronic circuit following each checkpoint and writes that waveform data to a storage device while simulating the circuit, and
 wherein at step c, the resumed checkpoint process determines the behavior of input signals of the first portion of the electronic circuit following the first checkpoint based on the waveform data written to the storage device.

7. The computer-readable media in accordance with claim 1 wherein
 the first re-simulation request invokes the first checkpoint by identifying a simulation time during the simulation carried out by the first simulation process, the identified simulation time being subsequent to the first checkpoint and prior to the next following checkpoint.

8. The computer-readable media in accordance with claim 1, wherein the first re-simulation request invokes the first checkpoint by identifying a simulation time subsequent to the first checkpoint and prior to the next following checkpoint.

9. The computer-readable media in accordance with claim 1, wherein the first re-simulation request invokes the first checkpoint by identifying the first checkpoint.

10. The computer-readable media in accordance with claim 1, wherein the first simulation process executes program instructions indicating that the first simulation process is to be suspended upon reaching at least one breakpoint during its execution and the first re-simulation request invokes the first checkpoint by reference to a re-simulation time interval that commences subsequent to the first checkpoint and prior to the next following checkpoint and contains at least one breakpoint, and the resumed checkpoint process includes said one breakpoint.

11. Computer-readable media, which when read and executed by a computer employing an operating system enabling process forking, carries out a method for simulating behavior of an electronic circuit and then re-simulating behavior of at least a portion of the electronic circuit in response to an input re-simulation request, the method comprising the steps of:
 a. initiating a first simulation process for simulating the behavior of the electronic circuit; wherein the first simulation process forks at least one checkpoint to create a checkpoint process that is a copy of the first simulation process, and wherein the first simulation process simulates the behavior of the electronic circuit following each checkpoint;
 b. suspending each checkpoint process upon its creation;
 c. maintaining a count of suspended checkpoint processes, and
 d. terminating one suspended checkpoint process whenever the count reaches a predetermined limit.

12. The computer-readable media in accordance with claim 11, wherein the one suspended checkpoint process that is terminated at step d is an oldest suspended checkpoint.

13. The computer-readable media in accordance with claim 11 wherein the method further comprises the step of:
 e. writing checkpoint data to a storage device prior to terminating the one suspended checkpoint process, the checkpoint data representing a state of the one suspended checkpoint process terminated at step d.

14. The computer-readable media in accordance with claim 13 wherein the method further comprises the steps of:
 f. receiving a re-simulation request invoking a checkpoint at which the first simulation process forked a checkpoint process at step a;
 g. when checkpoint data representing the state of the checkpoint process forked at the identified checkpoint was written to the storage device at step e, responding to the re-simulation request received at step f by reading the checkpoint data from the storage device and initiating a second simulation process of a state determined in accordance with that checkpoint data, wherein the second simulation process simulates behavior of at least a portion of the circuit following the identified checkpoint.

15. The computer-readable media in accordance with claim 11 wherein the method further comprises the step of:
 e. receiving a re-simulation request invoking a checkpoint at which the first simulation process forked a checkpoint process at step a;
 f. when the suspended checkpoint process forked at the identified checkpoint was not terminated at step d, responding to the request received at step e by resuming that suspended checkpoint process so that the resumed checkpoint process simulates behavior of at least a portion of the circuit following the identified checkpoint.

16. The computer-readable media in accordance with claim 11 wherein the method further comprises the step of:
 e. receiving a re-simulation request invoking a checkpoint at which the first simulation process forked a checkpoint process at step a;
 f. when the suspended checkpoint process forked at the identified checkpoint was not terminated at step d, responding to the request received at step e by forking that suspended checkpoint process to create a suspended second simulation process, and resuming one of the checkpoint process suspended at step b and the suspended second simulation process so that the resumed process simulates the behavior of at least a portion of the circuit following the identified checkpoint.

17. Computer-readable media, which when read and executed by a computer employing an operating system enabling process forking, causes the computer to carry out a method for simulating behavior of an electronic circuit and then re-simulating behavior of at least a portion of the electronic circuit in response to an input re-simulation request, the method comprising the steps of:
 a. initiating a first simulation process for simulating the behavior of the electronic circuit; wherein the first simulation process forks at least one checkpoint to create a checkpoint process that is a copy of the first simulation process, and wherein the first simulation process simulates the behavior of the electronic circuit following each checkpoint;
 b. suspending each checkpoint process upon its creation; and
 c. responding to a first re-simulation request invoking a first checkpoint by forking the checkpoint process that was created at the first checkpoint to create a second suspended simulation process and resuming one of the suspended checkpoint process and the second suspended simulation process so that the resumed process simulates the behavior of at least a portion of the circuit following the first checkpoint.

18. The computer-readable media in accordance with claim 17 wherein the first re-simulation request invokes the first checkpoint by identifying a simulation time during the simulation carried out by the first simulation process, the identified simulation time being subsequent to the first checkpoint and prior to the next following checkpoint.

19. The computer-readable media in accordance with claim 17 wherein the first simulation process executes program instructions indicating that the first simulation process is to be suspended upon reaching at least one breakpoint during its execution, the first re-simulation request invokes the first checkpoint by identifying a re-simulation time interval that commences subsequent to the first checkpoint and prior to the next following checkpoint and contains at least one breakpoint.

20. The computer-readable media in accordance with claim 19 wherein the first re-simulation process identifies the re-simulation time interval and at least one breakpoint during the re-simulation time interval, and the resumed process includes the identified breakpoint.

21. The computer-readable media in accordance with claim 17
 wherein the first simulation process generates waveform data representing behavior of input signals to a first portion of the electronic circuit following each checkpoint and writes that waveform data to a storage device while simulating the circuit, and
 wherein at step c, the resumed process determines the behavior of input signals of the first portion of the electronic circuit following the first checkpoint based on the waveform data written to the storage device.

22. The computer-readable media in accordance with claim 17, wherein step c comprises responding to the first re-simulation request by resuming the checkpoint process that was created at the first checkpoint, forking the resumed checkpoint process to create a second suspended simulation process, suspending the resumed checkpoint process, and resuming the second suspended simulation process so that the resumed process simulates the behavior of at least a portion of the circuit following the first checkpoint.

* * * * *